(12) United States Patent
Mehta et al.

(10) Patent No.: US 7,326,937 B2
(45) Date of Patent: Feb. 5, 2008

(54) PLASMA ION IMPLANTATION SYSTEMS AND METHODS USING SOLID SOURCE OF DOPANT MATERIAL

(75) Inventors: Sandeep Mehta, Beverly, MA (US); Steven R. Walther, Andover, MA (US); Naushad K. Variam, Marblehead, MA (US)

(73) Assignee: Verian Semiconductor Equipment Associates, Inc., Gloucester, MA (US)

( * ) Notice: Subject to any disclaimer, the term of this patent is extended or adjusted under 35 U.S.C. 154(b) by 64 days.

(21) Appl. No.: 11/076,696

(22) Filed: Mar. 9, 2005

(65) Prior Publication Data

US 2006/0219952 A1  Oct. 5, 2006

(51) Int. Cl.
  *H01J 27/00* (2006.01)
(52) U.S. Cl. ............................ 250/423 R; 250/492.21
(58) Field of Classification Search ............ 250/423 R, 250/492.21
  See application file for complete search history.

(56) References Cited

U.S. PATENT DOCUMENTS

| | | | |
|---|---|---|---|
| 4,791,273 A | 12/1988 | Satoh et al. | |
| 4,987,007 A * | 1/1991 | Wagal et al. | ............... 427/526 |
| 5,354,381 A | 10/1994 | Sheng | |
| 5,380,683 A * | 1/1995 | Tyson et al. | ................ 438/479 |
| 5,693,376 A * | 12/1997 | Fetherston et al. | ......... 427/523 |
| 5,780,803 A | 7/1998 | Goedicke et al. | |
| 6,020,592 A | 2/2000 | Liebert et al. | |
| 6,182,604 B1 | 2/2001 | Goeckner et al. | |

FOREIGN PATENT DOCUMENTS

WO  WO 03/049142 A1  6/2003

* cited by examiner

*Primary Examiner*—David Vanore (57) ABSTRACT

Plasma ion implantation apparatus includes a process chamber, a platen located in the process chamber for supporting a substrate, a dopant source including a solid dopant element and a vaporizer to vaporize dopant material from the solid dopant element, a plasma source to produce a plasma containing ions of the dopant material, and an implant pulse source to apply implant pulses to the platen for accelerating the ions of the dopant material from the plasma into the substrate.

26 Claims, 8 Drawing Sheets

PLASMA ION IMPLANTATION SYSTEMS AND METHODS USING SOLID SOURCE OF DOPANT MATERIAL

FIELD OF THE INVENTION

This invention relates to systems and methods for plasma ion implantation of substrates and, more particularly, to plasma ion implantation systems and methods using a solid source of a dopant material.

BACKGROUND OF THE INVENTION

Ion implantation is a standard technique for introducing conductivity-altering impurities into semiconductor wafers. In a conventional beamline ion implantation system, a desired impurity material is ionized in an ion source, the ions are accelerated to form an ion beam of prescribed energy, and the ion beam is directed at the surface of the wafer. Energetic ions in the beam penetrate into the bulk of the semiconductor material and are embedded into the crystalline lattice of the semiconductor material to form a region of desired conductivity.

A well-known trend in the semiconductor industry is toward smaller, higher speed devices. In particular, both the lateral dimensions and the depths of features in semiconductor devices are decreasing. The implanted depth of the dopant material is determined, at least in part, by the energy of the ions implanted into the semiconductor wafer. Beamline ion implanters are typically designed for efficient operation at relatively high implant energies and may not function efficiently at the low energies required for shallow junction implantation.

Plasma doping systems have been studied for forming shallow junctions in semiconductor wafers. In a plasma doping system, a semiconductor wafer is placed on a conductive platen, which functions as a cathode and is located in a process chamber. An ionizable process gas containing the desired dopant material is introduced into the chamber, and a voltage pulse is applied between the platen and an anode or the chamber walls, causing formation of a plasma having a plasma sheath in the vicinity of the wafer. The applied pulse causes ions in the plasma to cross the plasma sheath and to be implanted into the wafer. The depth of implantation is related to the voltage applied between the wafer and the anode. Very low implant energies can be achieved. Plasma doping systems are described, for example, in U.S. Pat. No. 5,354,381, issued Oct. 11, 1994 to Sheng; U.S. Pat. No. 6,020,592, issued Feb. 1, 2000 to Liebert et al.; and U.S. Pat. No. 6,182,604, issued Feb. 6, 2001 to Goeckner et al.

In the plasma doping systems described above, the applied voltage pulse generates a plasma and accelerates positive ions from the plasma toward the wafer. In other types of plasma systems, known as plasma immersion systems, continuous or pulsed RF energy is applied to the process chamber, thus producing a continuous plasma. At intervals, negative voltage pulses, which may be synchronized with the RF pulses, are applied between the platen and the anode, causing positive ions in the plasma to be accelerated toward the wafer.

In prior art plasma ion implantation systems, a process gas containing the dopant material is supplied to the process chamber for ionization and acceleration of the ions thus formed into the wafer. This approach has certain disadvantages. The process gases utilized for plasma ion implantation are frequently toxic, thus requiring safety precautions which have the effect of significantly increasing the overall processing time. For example, following completion of plasma ion implantation, the process gas is pumped from the process chamber before the wafer is moved from the process chamber to the load lock in order to reduce the risk of contamination. When a new wafer is loaded into the process chamber, the process gas is introduced into the chamber after the load lock and process chamber are isolated. These steps add to the overall process time.

In addition, process gases are typically provided as compounds which include both the desired dopant material and undesired species. For example, boron may be supplied as $BF_3$ or $B_2H_6$. In beamline ion implanters, the undesired species are removed from the ion beam by a mass analyzer. However, plasma ion implantation systems do not include a mass analyzer. Thus, undesired species, such as hydrogen or fluorine, are implanted into the wafer with the desired dopant material. The undesired species may be unacceptable in some applications.

Accordingly, there is a need for plasma ion implantation systems and methods which overcome some or all of the above disadvantages.

SUMMARY OF THE INVENTION

According to a first aspect of the invention, plasma ion implantation apparatus comprises a process chamber, a platen located in the process chamber for supporting a substrate, a dopant source including a solid dopant element and a vaporizer to vaporize dopant material from the solid dopant element, a plasma source to produce a plasma containing ions of the dopant material, and an implant pulse source to apply implant pulses to the platen for accelerating the ions of the dopant material from the plasma into the substrate.

The vaporizer may include at least one electron beam source or at least one laser directed at the solid dopant element. In some embodiments, the vaporizer may comprise an array of vaporizer elements. Each of the vaporizer elements may include a source to generate a beam and a scanner to scan the beam over the solid dopant element. In other embodiments, the vaporizer includes a heater in thermal contact with the solid dopant element. The vaporizer may be enabled during the implant pulses and inhibited between implant pulses.

The solid dopant element may comprise a plate spaced from and parallel to the platen in the process chamber. The plate may include a solid body of the dopant material or a base plate and a layer of solid dopant material on the base plate. The plate may include holes to permit ions of the dopant material to diffuse into a region near the platen.

According to a second aspect of the invention, a method is provided for plasma ion implantation of a substrate. The method comprises providing a plasma ion implantation system including a process chamber and a platen to support the substrate in the process chamber, vaporizing dopant material from a solid dopant element, generating a plasma containing ions of the vaporized dopant material, and accelerating the ions of the dopant material from the plasma into the substrate.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
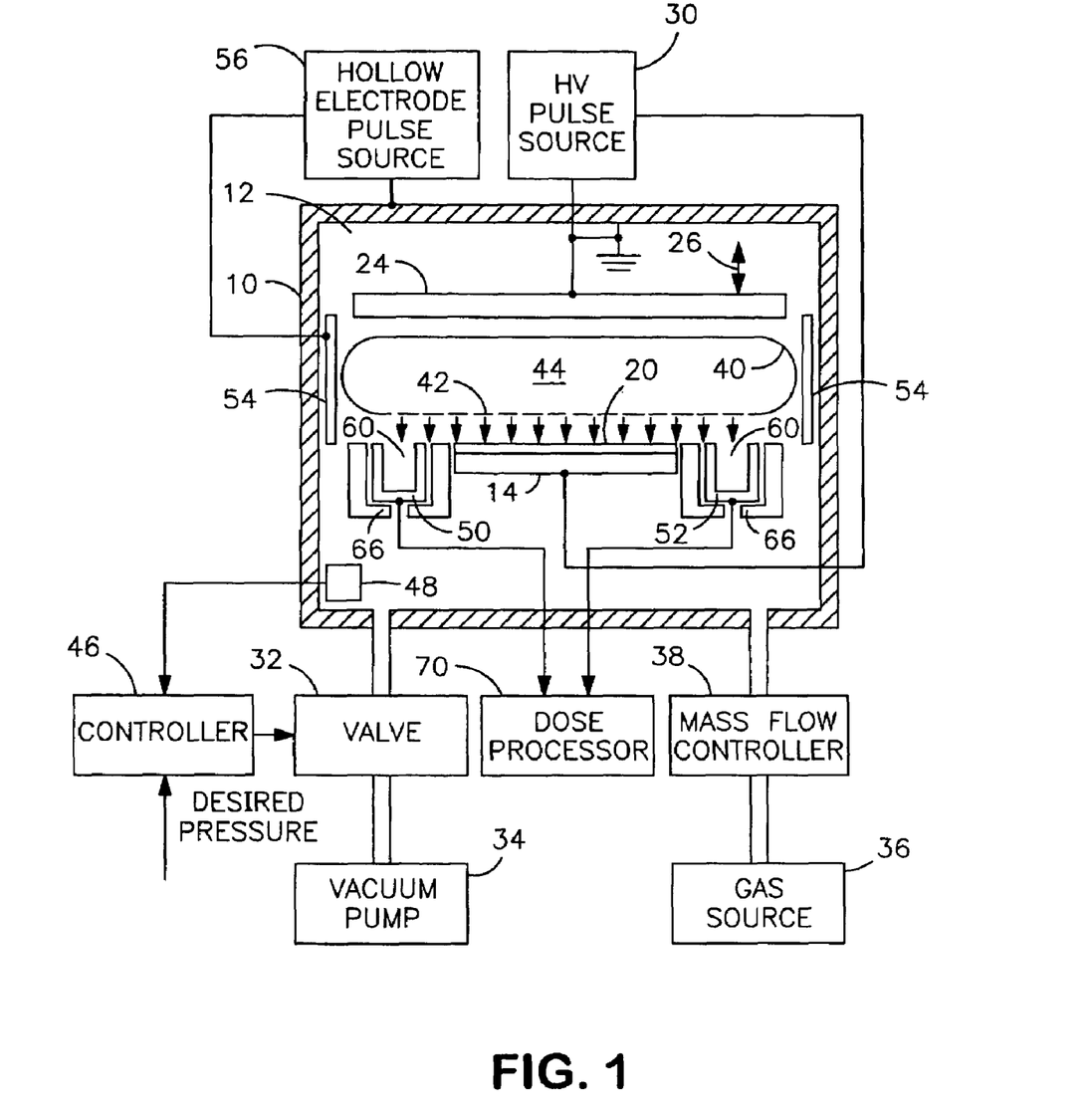
FIG. 1 is a simplified schematic block diagram of a prior art plasma ion implantation system.

A prior art plasma ion implantation system is shown schematically in FIG. 1. A process chamber 10 defines an enclosed volume 12. A platen 14 positioned within chamber 10 provides a surface for holding a substrate, such as a semiconductor wafer 20. The wafer 20 may, for example, be clamped at its periphery to a flat surface of platen 14 or may be electrostatically clamped. In one embodiment, the platen has an electrically conductive surface for supporting wafer 20. In another embodiment, the platen includes conductive pins (not shown) for connection to wafer 20. In addition, platen 14 may be equipped with a heating/cooling system to control wafer/substrate temperature.

An anode 24 is positioned within chamber 10 in spaced relation to platen 14. Anode 24 may be movable in a direction, indicated by arrow 26, perpendicular to platen 14. The anode is typically connected to electrically conductive walls of chamber 10, both of which may be connected to ground. In another embodiment, platen 14 is connected to ground, and anode 24 may be biased with respect to ground. In further embodiments, both anode 24 and platen 14 may be biased with respect to ground.

The wafer 20 (via platen 14) and the anode 24 are connected to a high voltage pulse source 30, so that wafer 20 functions as a cathode. The pulse source 30 typically provides pulses in a range of about 20 to 20,000 volts in amplitude, about 1 to 200 microseconds in duration and a pulse repetition rate of about 100 Hz to 20 kHz. It will be understood that these pulse parameter values are given by way of example only and that other values may be utilized within the scope of the invention.

The enclosed volume 12 of chamber 10 is coupled through a controllable valve 32 to a vacuum pump 34. A process gas source 36 is coupled through a mass flow controller 38 to chamber 10. A pressure sensor 48 located within chamber 10 provides a signal indicative of chamber pressure to a controller 46. The controller 46 compares the sensed chamber pressure with a desired pressure input and provides a control signal to valve 32 or mass flow controller 38. The control signal controls valve 32 or mass flow controller 38 so as to minimize the difference between the chamber pressure and the desired pressure. Vacuum pump 34, valve 32, mass flow controller 38, pressure sensor 48 and controller 46 constitute a closed loop pressure control system. The pressure is typically controlled in a range of about 1 millitorr to about 500 millitorr, but is not limited to this range.

The process gas source 36 supplies an ionizable gas containing a desired dopant for implantation into the workpiece. Examples of ionizable gas include $BF_3$, $N_2$, Xe, $H_2$, $O_2$, Ar, $PH_3$, $PF_3$, $AsH_3$, $AsF_5$ and $B_2H_6$. Mass flow controller 38 regulates the rate at which gas is supplied to chamber 10. The configuration shown in FIG. 1 provides a continuous flow of process gas at a desired flow rate and constant pressure. The pressure and gas flow rate are preferably regulated to provide repeatable results. In another embodiment, the gas flow may be regulated using a valve controlled by controller 46 while valve 32 is kept at a fixed position. Such an arrangement is referred to as upstream pressure control. Other configurations for regulating gas pressure may be utilized.

The plasma ion implantation system may include a hollow cathode 54 connected to a hollow cathode pulse source 56. In one embodiment, the hollow cathode 54 comprises a conductive hollow cylinder that surrounds the space between anode 24 and platen 14. The hollow cathode may be utilized in applications which require very low ion energies. In particular, hollow cathode pulse source 56 provides a pulse voltage that is sufficient to form a plasma within chamber 12, and pulse source 30 establishes a desired implant voltage. Additional details regarding the use of a hollow cathode are provided in the aforementioned U.S. Pat. No. 6,182,604, which is hereby incorporated by reference.

One or more Faraday cups may be positioned adjacent to platen 14 for measuring the ion dose implanted into wafer 20. In the embodiment of FIG. 1, Faraday cups 50, 52, etc. are equally spaced around the periphery of wafer 20. Each Faraday cup comprises a conductive enclosure having an entrance 60 facing plasma 40. Each Faraday cup is preferably positioned as close as is practical to wafer 20 and intercepts a sample of the positive ions accelerated from plasma 40 toward platen 14. In another embodiment, an annular Faraday cup is positioned around wafer 20 and platen 14.

The Faraday cups are electrically connected to a dose processor 70 or other dose monitoring circuit. Positive ions entering each Faraday cup through entrance 60 produce in the electrical circuit connected to the Faraday cup a current that is representative of ion current. The dose processor 70 may process the electrical current to determine ion dose.

The plasma ion implantation system may include a guard ring 66 that surrounds platen 14. The guard ring 66 may be biased to improve the uniformity of implanted ion distribution near the edge of wafer 20. The Faraday cups 50, 52 may be positioned within guard ring 66 near the periphery of wafer 20 and platen 14.

The plasma ion implantation system may include additional components, depending on the configuration of the system. The system typically includes a process control system (not shown) which controls and monitors the components of the plasma ion implantation system to implement a desired implant process. Systems which utilize continuous or pulsed RF energy include an RF source coupled to an antenna or an induction coil. The system may include magnetic elements which provide magnetic fields that confine electrons and control plasma density and spatial distribution. The use of magnetic elements in plasma ion implantation systems is described, for example, in WO 03/049142, published 12 Jun. 2003, which is hereby incorporated by reference.

In operation, wafer 20 is positioned on platen 14. The pressure control system, mass flow controller 38 and gas source 36 produce the desired pressure and gas flow rate within chamber 10. By way of example, the chamber 10 may operate with $BF_3$ gas at a pressure of 10 millitorr. The pulse source 30 applies a series of high voltage pulses to wafer 20, causing formation of plasma 40 in a plasma discharge region 44 between wafer 20 and anode 24. As known in the art, plasma 40 contains positive ions of the ionizable gas from gas source 36. Plasma 40 includes a plasma sheath 42 in the vicinity, typically at the surface, of wafer 20. The electric field that is present between anode 24 and platen 14 during the high voltage pulse accelerates positive ions from plasma 40 across plasma sheath 42 toward platen 14. The accelerated ions are implanted into wafer 20 to form regions of impurity material. The pulse voltage is selected to implant the positive ions to a desired depth in wafer 20. The number of pulses and the pulse duration are selected to provide a desired dose of impurity material in wafer 20. The current per pulse is a function of pulse voltage, pulse width, pulse frequency, gas pressure and species and any variable position of the electrodes. For example, the cathode-to-anode spacing may be adjusted for different voltages.

Schematic block diagrams of plasma ion implantation systems in accordance with embodiments of the invention are shown in FIGS. 2 and 5-8. The plasma ion implantation systems of FIGS. 2 and 5-8 may be modifications of the system shown in FIG. 1 and described above. System components shown in FIG. 1 may be omitted for simplicity of illustration and to facilitate an understanding of the invention. Like elements in FIGS. 1-9 have the same reference numerals.

Figure 2:
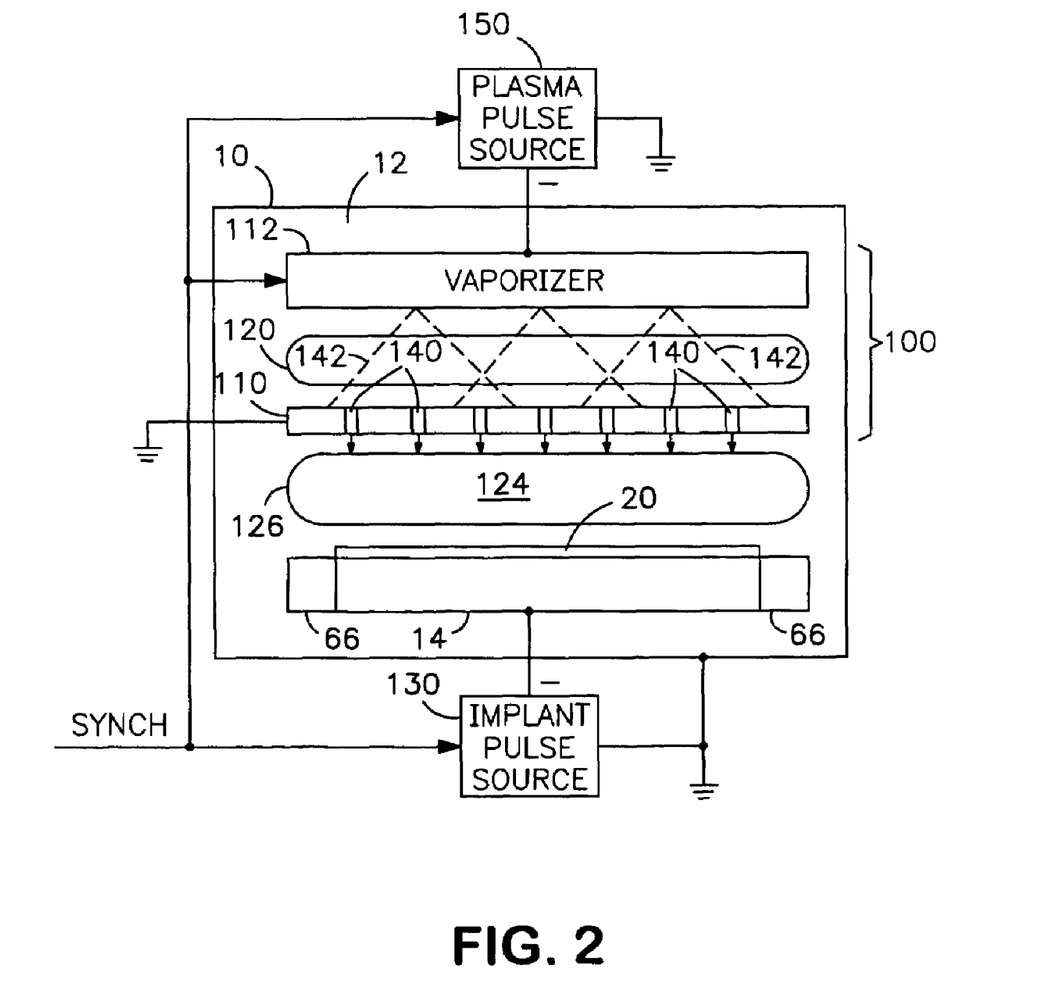
FIG. 2 is a simplified schematic block diagram of a plasma ion implantation system using a solid source of dopant material in accordance with a first embodiment of the invention.

A simplified schematic block diagram of a plasma ion implantation system in accordance with a first embodiment of the invention is shown in FIG. 2. The gas source 36 and the mass flow controller 38 of FIG. 1 are not utilized to supply a dopant material. In some embodiments, gas source 36 and mass flow controller 38 are not required. In other embodiments, gas source 36 and mass flow controller 38 may supply an inert gas to process chamber 10.

The plasma ion implantation system of FIG. 2 includes a dopant source 100, typically located within process chamber 10. Dopant source 100 includes a solid dopant element 110, which serves as a source of dopant material, and a vaporizer 112 to vaporize dopant material from solid dopant element 110. Dopant source 100 thus has a solid source of dopant material. A plasma source produces between solid dopant element 110 and vaporizer 112 a plasma 120 containing ions of the dopant material. The ions of the dopant material diffuse through holes in solid dopant element 110 to a region 124 between solid dopant element 110 and platen 14. A plasma 126 in region 124 contains ions of the dopant material. Implant pulses supplied by an implant pulse source 130 connected to platen 14 accelerate the ions of the dopant material from plasma 126 into wafer 20.

Solid dopant element 110 may be a solid body of dopant material, such as boron, or may be configured as a base and a solid layer of dopant material formed on the base. The base may be silicon, silicon carbide, boron carbide, or a silicon-boron compound, for example. In other embodiments, solid dopant element 110 may include two or more dopant materials in different areas or a mixture of two or more dopant materials. In the embodiment of FIG. 2, solid dopant element 110 is configured as a flat plate spaced from and parallel to platen 14. The plate may include holes 140 to permit ions of the dopant material to diffuse from plasma 120 into region 124 above wafer 20. The holes 140 may be holes or slots having dimensions of 1 to 10 millimeters and spacings of 1 to 10 millimeters, but are not limited to these values. Dopant materials suitable for use in the solid dopant element 110 include, but are not limited to, boron, boron carbide, boron-silicon compounds, arsenic and phosphorous.

Dopant material may be ablated or vaporized from solid dopant element 110 by beams 142 generated by vaporizer 112. As discussed below, beams 142 may be electron beams or light beams that are scanned over the surface of solid dopant element 110. In other embodiments, vaporizer 112 may generate one or more fixed beams directed at solid dopant element 110. The vaporized dopant material is ionized in plasma 120 to form ions of the dopant material.

The embodiment of FIG. 2 utilizes a pulsed glow discharge plasma source. A plasma pulse source 150 applies negative pulses to a housing of vaporizer 112, and the solid dopant element 110 may be connected to ground. The pulses applied to vaporizer 112 cause formation of plasma 120 between vaporizer 112 and solid element 110 and ionization of the dopant material.

The operation of the plasma ion implantation system may be synchronized such that vaporizer 112, plasma pulse source 150 and implant pulse source 130 are triggered to produce simultaneous or overlapping pulsed operation. In the embodiment of FIG. 2, vaporizer 112, plasma pulse source 150 and implant pulse source 130 are triggered by a synchronization pulse provided by a system controller (not shown). Pulsed operation of the vaporizer 112 limits deposition on the surface of wafer 20 of dopant material that has not been ionized. In other embodiments, vaporizer 112, plasma pulse source 150 and implant pulse source 130 may be triggered by different pulses from the controller. For example, vaporizer 112 and plasma pulse source 150 may be triggered slightly earlier than implant pulse source 130 so that ions of the dopant material are available for implantation into wafer 20 when the implant pulse source 130 is triggered.

In operation, vaporizer 112 is pulsed on and vaporizes dopant material from solid element 110. Plasma pulse source 150 applies a negative pulse to vaporizer 112, causing formation of plasma 120 between solid element 110 and vaporizer 112, and ionization of the dopant material. The ions of the dopant material diffuse through holes 140 into region 124. The implant pulse source 130 applies a negative pulse to platen 114, causing the ions of the dopant material to be accelerated from plasma 126 into wafer 20.

Figure 3:
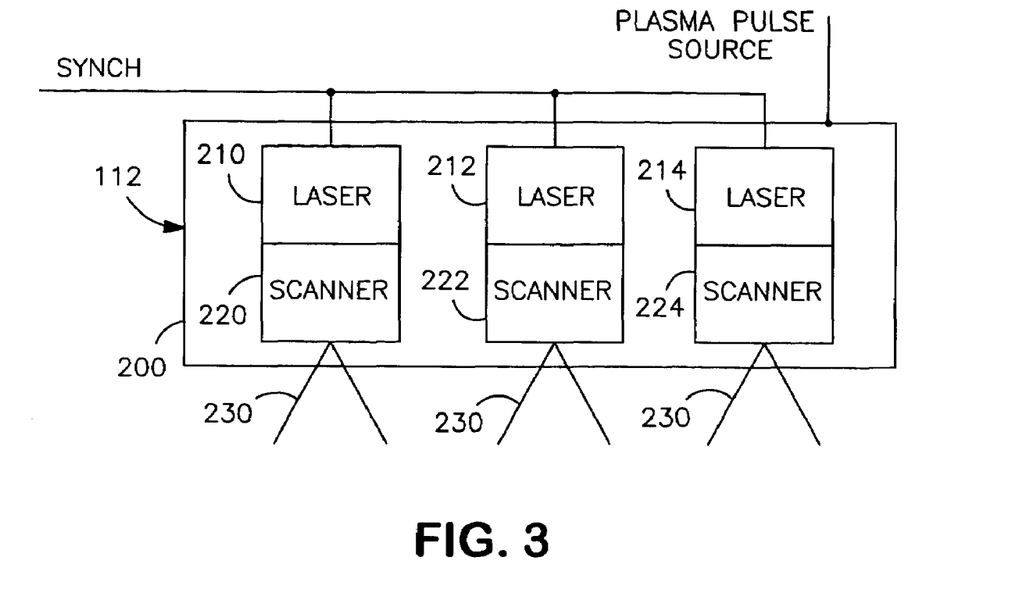
FIG. 3 is a simplified schematic block diagram of a vaporizer in accordance with a second embodiment of the invention.

A simplified schematic block diagram of vaporizer 112 in accordance with a second embodiment of the invention is shown in FIG. 3. A vaporizer housing 200 encloses an array of lasers 210, 212 and 214. Laser beams produced by lasers 210, 212 and 214 are coupled to scanners 220, 222 and 224, respectively. Scanners 220, 222 and 224 produce scanned laser beams 230, which are directed at solid dopant element 110 (FIG. 2) to vaporize dopant material. It will be understood that the vaporizer 112 may contain any desired number of lasers and corresponding scanners in any desired arrangement. Housing 200 may be connected to plasma pulse source 150 (FIG. 2) for application of a negative pulse to generate a pulse glow discharge in process chamber 10. The synchronization pulse is applied to lasers 210, 212 and 214 and, preferably, energizes the lasers during implant pulses generated by implant pulse source 130. Scanners 220, 222 and 224 distribute the scanned laser beams 230 over the surface of solid dopant element 110 in order to achieve a relatively uniform distribution of implanted dopant ions in wafer 20. Accordingly, the scan period is preferably less than the pulse width of the implant pulses.

Figure 4:
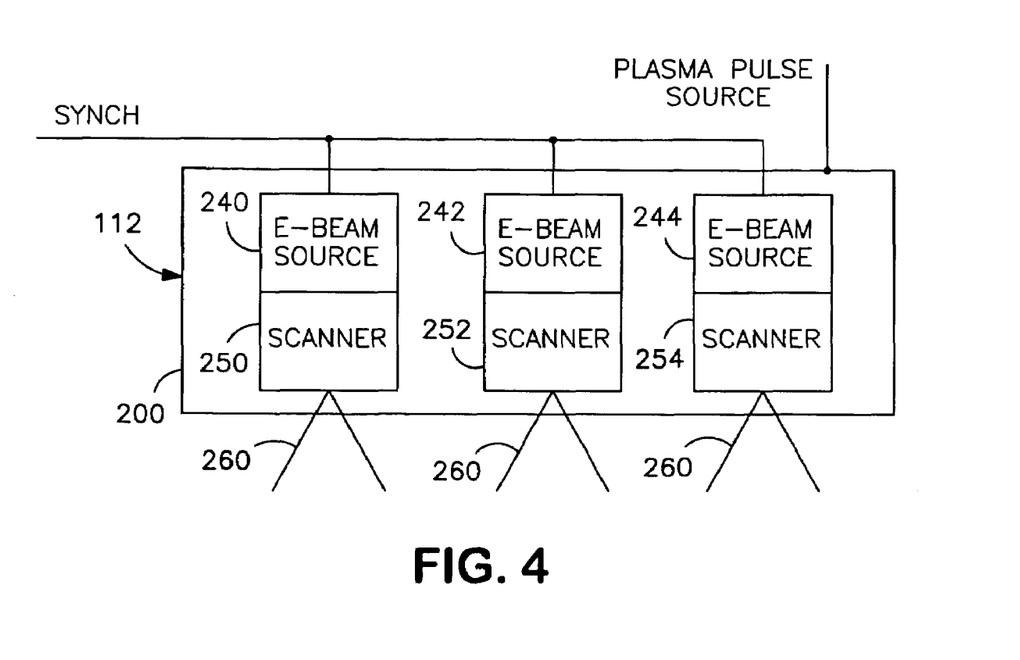
FIG. 4 is a simplified schematic block diagram of a vaporizer in accordance with a third embodiment of the invention.

A simplified schematic block diagram of vaporizer 112 in accordance with a third embodiment of the invention is shown in FIG. 4. Housing 200 encloses an array of electron beam sources 240, 242 and 244. Electron beams produced by electron beam sources 240, 242 and 244 are supplied to scanners 250, 252 and 254, respectively, to produce scanned electron beams 260. The scanned electron beams 260 are directed toward solid dopant element 110 to vaporize dopant material from solid dopant element 110. As in the case of scanned laser beams 230, the scanners distribute the scanned electron beams 260 over the surface of solid dopant element 110 in order to achieve a relatively uniform distribution of implanted dopant ions in wafer 20. The scan period is preferably less than the pulse width of the implant pulses. Housing 200 may be connected to plasma pulse source 150 (FIG. 2) for application of a negative pulse to generate plasma 120 containing ions of the dopant material.

Figure 5:
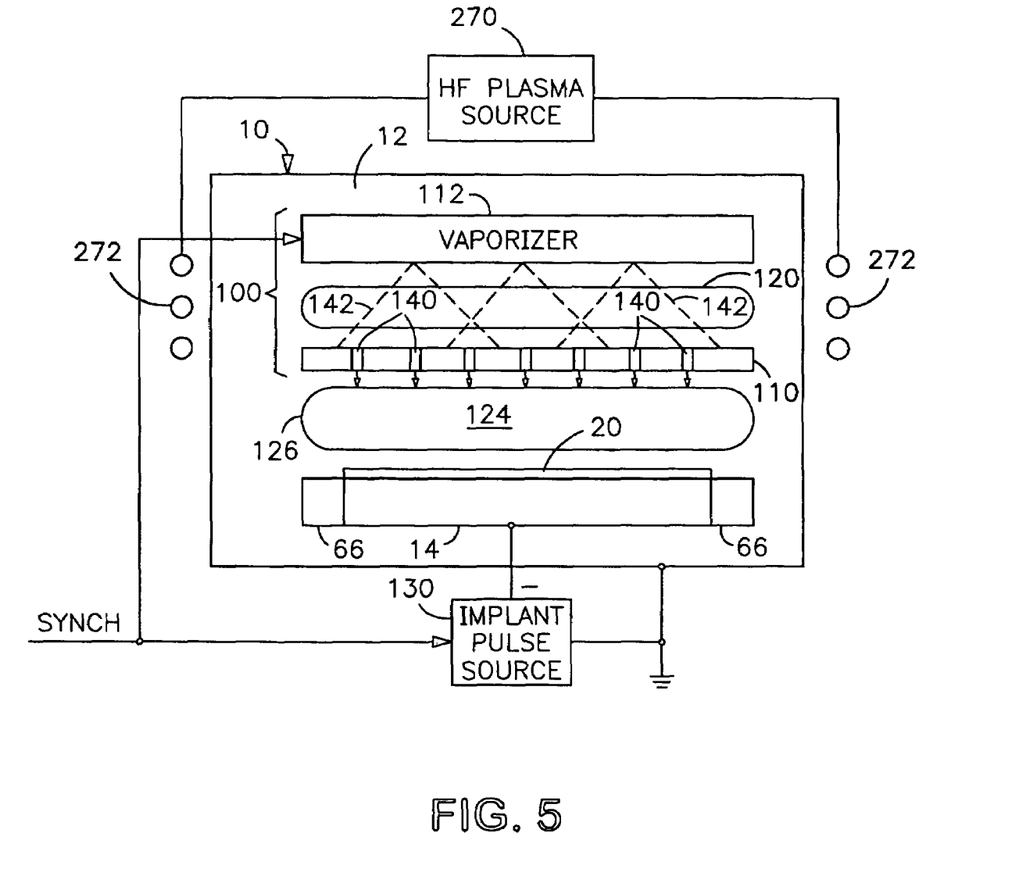
FIG. 5 is a simplified schematic block diagram of a plasma ion implantation system using a solid source of dopant material in accordance with a fourth embodiment of the invention.

A simplified schematic block diagram of a plasma ion implantation system in accordance with a fourth embodiment of the invention is shown in FIG. 5. The embodiment of FIG. 5 includes dopant source 100 having a solid source of dopant material. The embodiment of FIG. 5 differs from the embodiment of FIG. 2 with respect to the plasma source. A high frequency plasma source 270 is coupled to an induction coil 272 positioned outside process chamber 12 in the region of dopant source 100. Induction coil 272 may have a helical configuration. High frequency plasma source 270 may operate in an RF or microwave frequency range of 0.1 MHz to 10 GHz. Plasma source 270 and induction coil 272 generate plasma 120 between vaporizer 112 and solid dopant element 110 to ionize vaporized dopant material from solid dopant element 110. In some embodiments, high frequency plasma source 270 produces a continuous plasma of an inert gas, such as argon, helium, xenon, neon, or krypton, for example, and dopant source 100 generates pulsed quantities of vaporized dopant material which are ionized in plasma 120. In other embodiments, high frequency plasma source 270 may be pulsed in synchronism with vaporizer 112 and implant pulse source 130.

Figure 6:
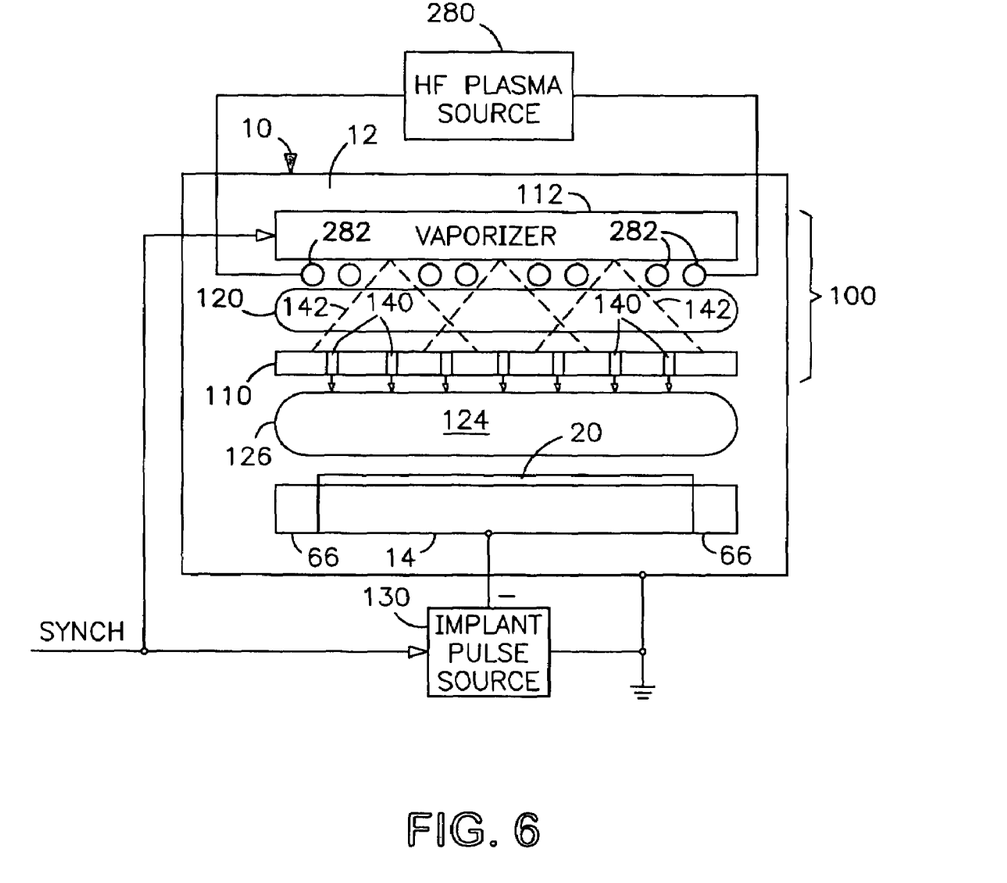
FIG. 6 is a simplified schematic block diagram of a plasma ion implantation system using a solid source of dopant material in accordance with a fifth embodiment of the invention.

A simplified schematic block diagram of a plasma ion implantation system in accordance with a fifth embodiment of the invention is shown in FIG. 6. The embodiment of FIG. 6 includes dopant source 100. A plasma source includes a high frequency plasma source 280 coupled to a flat induction coil 282 located in process chamber 10 between vaporizer 112 and solid dopant element 110. The embodiment of FIG. 6 operates in generally the same manner as the embodiment of FIG. 5 described above.

Figure 7:
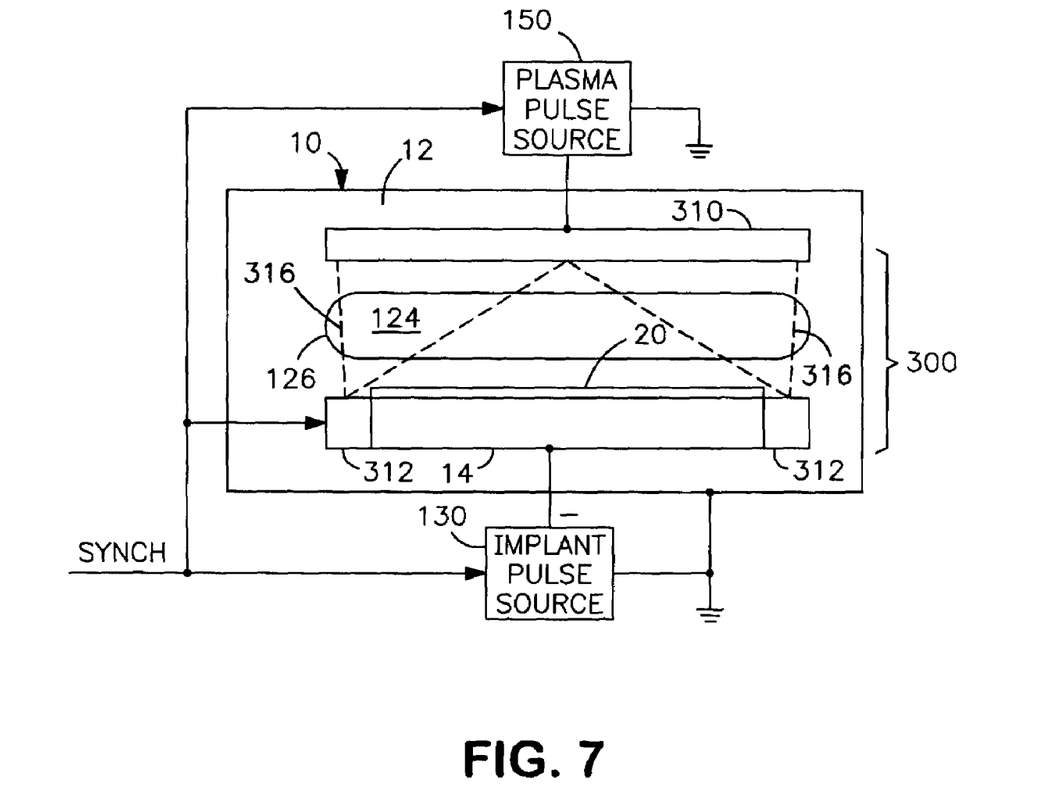
FIG. 7 is a simplified schematic block diagram of a plasma ion implantation system using a solid source of dopant material in accordance with a sixth embodiment of the invention.

A simplified schematic block diagram of a plasma ion implantation system in accordance with a sixth embodiment of the invention is shown in FIG. 7. In the embodiment of FIG. 7, a dopant source 300 includes a solid dopant element 310 spaced from platen 14 in process chamber 10 and a vaporizer 312 positioned around platen 14. Vaporizer 312 directs beams 316 at solid dopant element 310 from below to vaporize dopant material as described above. Beams 316 may be scanned laser beams or scanned electron beams. In other embodiments, one or more fixed beams may be utilized. Solid dopant element 310 may be a body of solid dopant material or may include a base having a layer of solid dopant material on its lower surface. Solid dopant element 310 may be configured as a flat plate spaced from and parallel to platen 14. Because vaporizer 312 and platen 14 are located on the same side of solid dopant element 310, solid dopant element 310 is not required to have holes as in the embodiments of FIGS. 2, 5 and 6. Plasma pulse source 150 may provide positive or negative pulses to solid dopant element 310 to generate plasma 126 containing ions of the dopant material in region 124 between solid dopant element 310 and platen 14. The ions of the dopant material are accelerated by implant pulse source 330 into wafer 20. Vaporizer 312, plasma pulse source 150 and implant pulse source 130 may be triggered by a synchronization signal received from a controller (not shown). It will be understood that the high frequency plasma sources shown in FIGS. 5 and 6 and described above may be utilized in the embodiment of FIG. 7.

Figure 8:
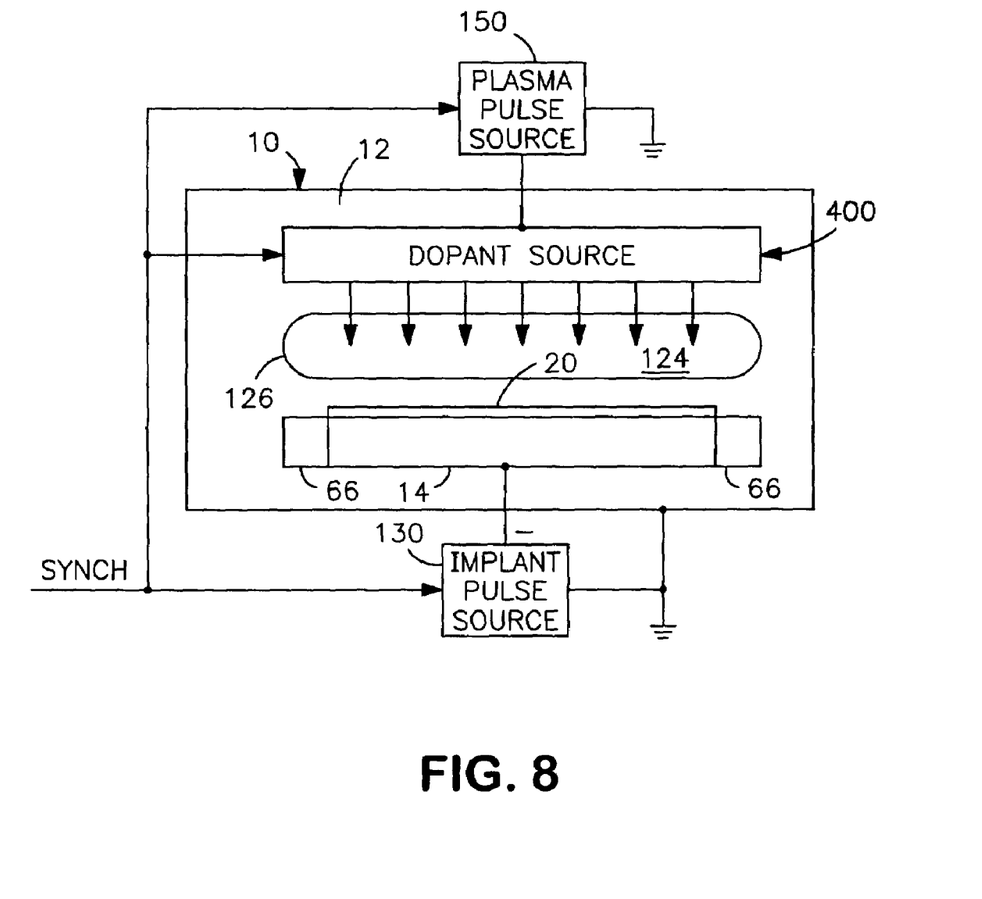
FIG. 8 is a simplified schematic block diagram of a plasma ion implantation system using a solid source of dopant material in accordance with a seventh embodiment of the invention.

A simplified schematic block diagram of a plasma ion implantation system in accordance with a seventh embodiment of the invention is shown in FIG. 8. A dopant source 400 supplies vaporized dopant material to plasma 126 from a solid source of dopant material. Voltage pulses applied by plasma pulse source 150 to dopant source 400 generate plasma 126 above platen 14. The ions of the dopant material are accelerated by implant pulses supplied by implant pulse source 130 into wafer 20. The dopant source 400, plasma pulse source 150 and implant pulse source 130 may be triggered by a synchronization pulse received from a controller (not shown). The high frequency plasma sources shown in FIGS. 5 and 6 and described above may be utilized in the embodiment of FIG. 8.

Figure 9:
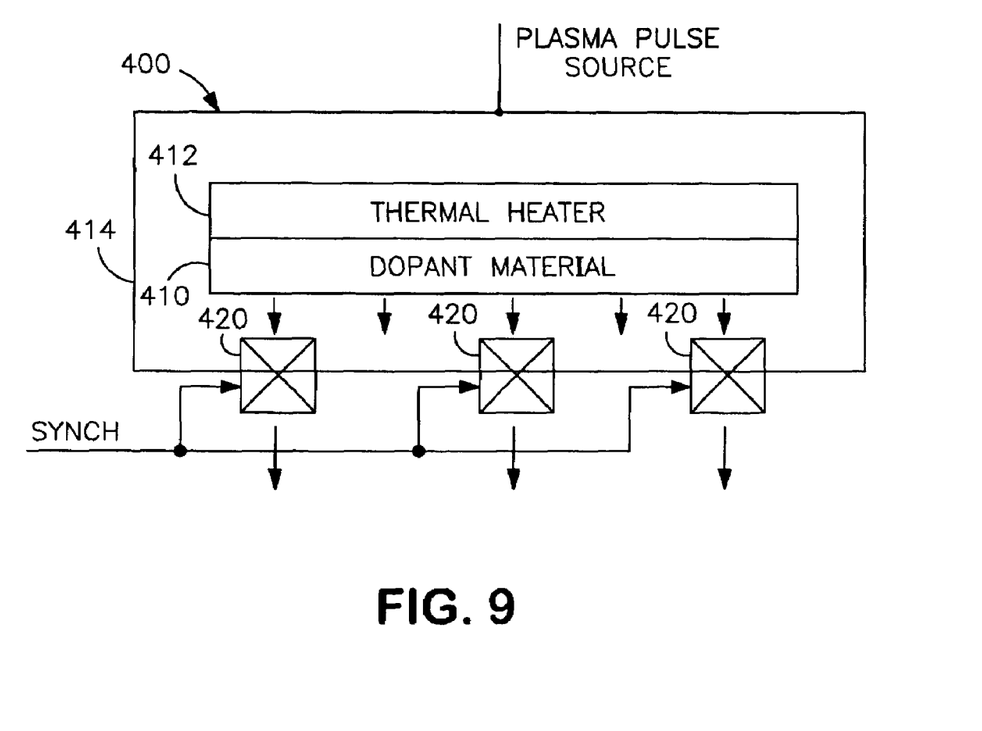
FIG. 9 is a simplified schematic block diagram of the dopant source shown in FIG. 8.

A simplified schematic block diagram of dopant source 400 is shown in FIG. 9. A solid dopant element 410 is in thermal contact with a vaporizer in the form of a thermal heater 412. Solid dopant element 410 and thermal heater 412 are located within a vaporizer housing 414. Thermal heater 412 may be energized continuously to vaporize dopant material from solid dopant element 410. Atoms of the dopant material are produced within housing 414 and are permitted to escape by an array of valves 420 in housing 200. Valves 420 may be controlled by a synchronization signal so as to allow atoms of the vaporized dopant material to enter the region above platen 14 for ionization and implantation. Valves 420 should be heated to limit deposition of the dopant material and valve clogging. By way of example only, valves 420 may be piezoelectric devices which can open and close at high speed in response to a control signal. Plasma pulse source 150 may be coupled to housing 414 for generation of plasma 126 as described above.

In the embodiments described above, a separate plasma source is utilized to ionize the vaporized dopant material. The plasma source may be a pulse glow discharge plasma source or a high frequency plasma source. In other embodiments, the vaporizer associated with the dopant source may produce sufficient energy to both vaporize and ionize the dopant material. For example, the scanned laser beams or scanned electron beams may be sufficient for vaporization and ionization. In such embodiments, a separate plasma source may not be required.

Having described several embodiments and an example of the invention in detail, various modifications and improvements will readily occur to those skilled in the art. Such modifications and improvements are intended to be within the spirit and the scope of the invention. Furthermore, those skilled in the art would readily appreciate that all parameters listed herein are meant to be exemplary and that actual parameters will depend upon the specific application for which the system of the present invention is used. Accordingly, the foregoing description is by way of example only and is not intended as limiting. The invention is limited only as defined by the following claims and their equivalents.

What is claimed is:

1. Plasma ion implantation apparatus comprising:
a process chamber;
a platen located in said process chamber to support a substrate;
a dopant source including a solid dopant element and a vaporizer to vaporize dopant material from the solid dopant element, the solid dopant element comprising a plurality of holes and being configured to transmit ions of vaporized dopant material via the plurality of holes;
a plasma source to produce a plasma containing ions of the dopant material; and
an implant pulse source to apply implant pulses to said platen for accelerating the ions of the dopant material from the plasma into the substrate.

2. The plasma ion implantation apparatus as defined in claim 1, wherein said dopant source is located in the process chamber and is spaced from said platen.

3. The plasma ion implantation apparatus as defined in claim 1, wherein the vaporizer comprises at least one electron beam source directed at the solid dopant element.

4. The plasma ion implantation apparatus as defined in claim 1, wherein the vaporizer comprises at least one laser directed at the solid dopant element.

5. The plasma ion implantation apparatus as defined in claim 1, wherein the vaporizer comprises an array of vaporizer elements.

6. The plasma ion implantation apparatus as defined in claim 5, wherein the vaporizer elements are located within a vaporizer housing in the process chamber.

7. The plasma ion implantation apparatus as defined in claim 1, wherein the vaporizer comprises a thermal heater in thermal contact with the solid dopant element.

8. The plasma ion implantation apparatus as defined in claim 1, wherein the vaporizer comprises a thermal heater in thermal contact with the solid dopant element, a vaporizer housing enclosing the thermal heater, and the solid dopant element and one or more valves to permit vaporized dopant material to pass from the vaporizer housing to the plasma.

9. The plasma ion implantation apparatus as defined in claim 1, wherein the ions of the dopant material are generated in a region adjacent to the platen for acceleration into the substrate.

10. The plasma ion implantation apparatus as defined in claim 1, wherein the vaporizer comprises an array of vaporizer elements, wherein each of the vaporizer elements comprises a source to generate a beam and a scanner to scan the beam over the solid dopant element.

11. The plasma ion implantation apparatus as defined in claim 10, wherein the solid dopant element comprises a plate spaced from the platen in said process chamber.

12. Plasma ion implantation apparatus as defined in claim 1 further comprising a controller configured to operate the vaporizer in the first pulsed operation mode and configured to operate the implant pulse source in a second pulse operation mode.

13. Plasma ion implantation apparatus comprising:
a process chamber;
a platen located in said process chamber to support a substrate;
a dopant source including a solid dopant element and a vaporizer to vaporize dopant material from the solid dopant element;
a plasma source to produce a plasma containing ions of the dopant material; and
an implant pulse source to apply implant pulses to said platen for accelerating the ions of the dopant material from the plasma into the substrate, wherein the vaporizer comprises an array of vaporizer elements and each of the vaporizer elements comprises a source to generate a beam and a scanner to scan the beam over the solid dopant element, wherein the solid dopant element comprises a plate spaced from the platen in said process chamber, and the plate includes holes to permit ions of the dopant material to diffuse into a region near the platen.

14. The plasma ion implantation apparatus as defined in claim 11, wherein the plate comprises a solid body of the dopant material.

15. The plasma ion implantation apparatus as defined in claim 11, wherein the plate comprises a base plate and a solid layer of the dopant material on the base plate.

16. The plasma ion implantation apparatus as defined in claim 1, wherein the plasma source comprises a pulsed glow discharge plasma source.

17. The plasma ion implantation apparatus as defined in claim 1, wherein the plasma source comprises a microwave or RF plasma source.

18. A method for plasma ion implantation of a substrate, comprising:
providing a plasma ion implantation system including a process chamber and a platen to support a substrate in the process chamber;
providing a solid dopant element comprising a plurality of holes; vaporizing dopant material from a solid dopant element in a first pulsed operation
transmitting ions of the vaporized dopant material via the plurality of holes;
generating a plasma containing the ions of the vaporized dopant material; and accelerating the ions of the dopant material from the plasma into the substrate.

19. Plasma ion implantation apparatus as defined in claim 12, wherein the vaporizer is enabled to vaporize the solid dopant element during one time interval of the first pulsed operation mode and inhibited from vaporizing the solid dopant during another time interval of the first pulsed operation mode.

20. Plasma ion implantation apparatus as defined in claim 19, wherein the one time interval of the first pulsed operation mode comprises a time interval of the implant pulse and wherein the another time interval of the first pulse operation mode comprise time interval between the implant pulses.

21. Plasma ion implantation apparatus as defined in claim 12, wherein the controller is configured to substantially synchronize the first and second pulse operation modes.

22. The method as defined in claim 18 further comprising:
accelerating the ions of the dopant material from the plasma into the substrate in a second pulse operation mode.

23. The method as defined in claim 18, wherein the vaporizing dopant material during the first pulsed operation mode comprises enabling vaporizing of dopant material from the solid dopant element during one time interval and inhibiting vaporizing of dopant material from the solid dopant element during another time interval.

24. The method as defined in claim 23, wherein the one time interval of the first pulsed operation mode comprises a time interval of the implant pulse and wherein the another time interval of the first pulse operation mode comprises a time interval between the implant pulses.

25. Plasma ion implantation apparatus as defined in claim 23 further comprising:
substantially synchronizing the first and second pulse operation modes.

26. The method as defined in claim 25, wherein the synchronizing comprises enabling a vaporizer to vaporize dopant material from the solid dopant element when the ions are being accelerated from the plasma into the substrate and inhibiting the vaporizer when ions are not being accelerated from the plasma into the substrate.

* * * * *